United States Patent
Lubbers

(10) Patent No.: US 7,145,393 B1
(45) Date of Patent: Dec. 5, 2006

(54) OPERATIONAL AMPLIFIER WITH CLASS-AB+B OUTPUT STAGE

(75) Inventor: Alexander P. G. Lubbers, Lochem (NL)

(73) Assignee: SiTel Semiconductor B.V. (NL)

( * ) Notice: Subject to any disclaimer, the term of this patent is extended or adjusted under 35 U.S.C. 154(b) by 123 days.

(21) Appl. No.: 11/047,903

(22) Filed: Feb. 1, 2005

(51) Int. Cl.
*H03F 3/18* (2006.01)

(52) U.S. Cl. ...................... 330/264; 330/269

(58) Field of Classification Search ............ 330/255, 330/264, 269, 277
See application file for complete search history.

(56) References Cited

U.S. PATENT DOCUMENTS

| 4,206,419 A | * | 6/1980 | Yokoyama | 330/263 |
| 4,217,556 A | * | 8/1980 | Ito et al. | 330/268 |
| 4,451,802 A | * | 5/1984 | Koinuma | 330/297 |
| 6,917,246 B1 | * | 7/2005 | Thompson | 330/295 |
| 7,078,976 B1 | * | 7/2006 | Blednov | 330/286 |

* cited by examiner

*Primary Examiner*—Robert Pascal
*Assistant Examiner*—Hieu Nguyen

(57) ABSTRACT

An operational amplifier is provided that includes a Class-AB stage and a Class-B stage coupled in parallel with each other to form an output stage. The Class-AB stage is operable to drive an output load. The Class-B stage is also operable to drive the output load and includes a first level-shifting circuit and a second level-shifting circuit. Each of the level-shifting circuits includes a neutralizing transistor.

20 Claims, 2 Drawing Sheets

US 7,145,393 B1

OPERATIONAL AMPLIFIER WITH CLASS-AB+B OUTPUT STAGE

TECHNICAL FIELD OF THE INVENTION

The present invention relates generally to operational amplifiers and, more particularly, to a low-supply voltage operational amplifier having a Class-AB+B output stage with neutralization of level-shifters in the Class-B output stage.

BACKGROUND OF THE INVENTION

Increasingly, electronic devices are designed to operate from ever smaller power supply voltages. Smaller supply voltages are designed to minimize leakage currents and other undesirable effects that increase at smaller transistor sizes (e.g., 0.18 microns). Smaller supply voltages also save power, which is an especially important consideration in portable devices that operate from a battery. For example, current cellular telephones and other portable applications operate from a +1.8 volt power supply rail.

However, problems are encountered as power supply voltage levels become ever smaller. In applications where a given amount of power is required, the trend toward smaller supply voltages means that the current requirement must be increased to offset the reduced power supply voltage. For example, in a cellular telephone, a given amount of power is required to drive the speaker to an audible level. To maintain this power level, the current driving the speaker must increase as the output voltage decreases. The impedance of the speaker becomes smaller with the supply voltage in order to maintain the output power due to a larger current.

But difficulties are encountered when trying to combine a rail-to-rail output voltage range (0 to 1.8 volts) with a large output current (e.g., 60 mA). In order to drive a large current with a small drain-source voltage, $V_{DS}$, as is the case with the output transistors of a speaker driver, large W/L (channel width (W) to channel length (L) ratio) values are needed. As a result, the quiescent gate-to-source voltages, $V_{GS}$, of these transistors tend to become very small in order to keep the quiescent current, Iq, acceptably small.

However, if a Class-AB push-pull operational amplifier drives the speaker, the $V_{GS}$ of the push-pull transistors of the output stage should be at least larger than one saturation voltage $V_{DS,SAT}$ of the output transistors of the previous stage in order to maintain their high output resistance and thus the voltage gain of the first stage. Therefore, large output transistors become very difficult (or even impossible) to bias in a conventional Class-AB operational amplifier with an acceptably small quiescent current, Iq.

One solution to this problem that has been proposed provides for a Class-AB+B operational amplifier that is able to operate from small power supply voltage levels while still driving large output currents and having a small quiescent current. This solution divides the output transistors into relatively large Class-B output drivers in parallel with relatively small Class-AB transistors. The small Class-AB transistors have a minimum quiescent transconductance, whereas the Class-B current booster transistors are inactive in the quiescent state and only deliver large currents for output voltages approaching the power supply rails. The Class-B current booster stage has minimum impact on the Class-AB amplifier stage and can be adjusted independently whenever larger currents are needed in future applications.

However, with this approach, level shifters impede the gate-to-source voltages of the Class-B output transistors from becoming as large as the gate-to-source voltages of the Class-AB output transistors. As a result, the output voltage of the operational amplifier clips earlier than in comparable Class-AB stages with the same output transistors. Thus, the drive strength of the Class-B stage is not fully exploited.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
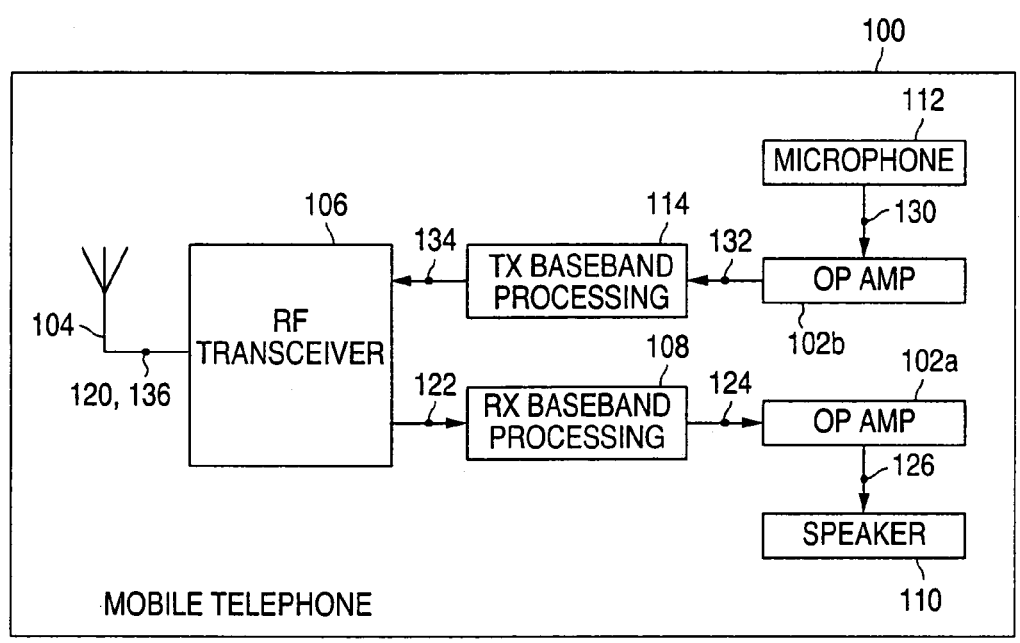
FIG. 1 is a block diagram illustrating a mobile telephone comprising improved operational amplifiers in accordance with one embodiment of the present invention.
Figure 2:
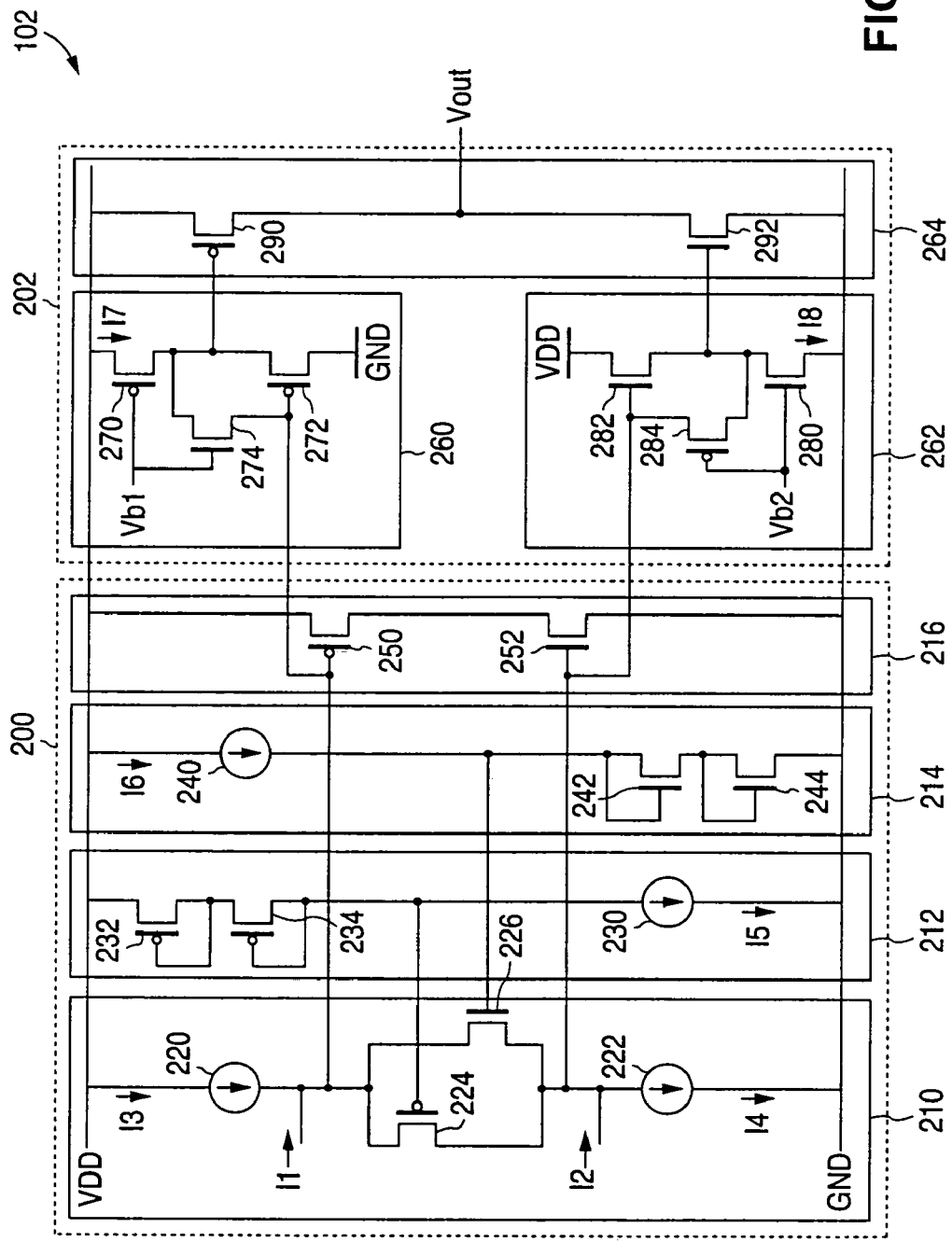
FIG. 2 is a circuit diagram illustrating details of a portion of one of the operational amplifiers of FIG. 1 in accordance with one embodiment of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

FIG. 1 is a block diagram illustrating a mobile telephone 100 comprising improved operational amplifiers (op amps) 102a and 102b in accordance with one embodiment of the present invention. In addition to the operational amplifiers 102, the mobile telephone 100 comprises an antenna 104, a radio frequency (RF) transceiver 106, a receive (RX) baseband processing block 108, a speaker 110, a microphone 112, and a transmit (TX) baseband processing block 114.

In the receive path, the RF transceiver 106 receives from the antenna 104 an incoming (i.e., forward channel) RF signal 120 and performs down-conversion and demodulation to produce a forward channel baseband signal 122. The receive baseband processing block 108 performs additional processing functions on the forward channel baseband signal 122, such as automatic gain control, error correction, de-interleaving, analog-to-digital conversion, and the like. At least a portion of the forward channel baseband signal 122 is converted to an analog audio signal 124 (e.g., voice signal) that is transferred to the operational amplifier 102a. The operational amplifier 102a generates an amplified audio signal 126 based on the analog audio signal 124 by amplifying the analog audio signal 124 to a suitable power level to drive the speaker 110.

In the transmit path, the microphone 112 converts audio data, such as the voice of the user of cell phone 100, to an analog audio signal 130 that is amplified by the operational amplifier 102b to generate an amplified audio signal 132. The transmit baseband processing block 114 receives the amplified audio signal 132 and performs additional processing functions, such as automatic gain control, error encoding, interleaving, digital-to-analog conversion, and the like. In essence, the transmit baseband processing block 114 performs the opposite of many of the functions performed by the receive baseband processing block 108. The output of the transmit baseband processing block 114 is a reverse channel baseband signal 134. The RF transceiver 106 performs modulation and up-conversion of the reverse channel baseband signal 134 to produce an outgoing RF signal 136 that is transmitted by the antenna 104.

According to one embodiment of the present invention, many of the circuits in the cell phone 100 operate from relatively small supply voltages. For example, the operational amplifiers 102 may operate from a +1.8 volt power supply rail. To avoid problems associated with driving large current loads from a small power supply rail, the operational amplifiers 102, as well as other circuits in the cell phone 100, may implement Class-AB+B output stages according to the principles of the present invention. In addition, as described in more detail below, the operational amplifiers 102 each comprise a Class-B output stage that is operable to neutralize level shifters in the driving branch (push or pull) when the output voltage of the operational amplifier 102 is at a fair distance from its quiescent level, thereby fully exploiting the drive strength of the Class-B output stage.

FIG. 2 is a circuit diagram illustrating details of a portion of one of the operational amplifiers 102 in accordance with one embodiment of the present invention. The output stage of the operational amplifier 102 comprises a Class-AB stage 200 and a Class-B stage 202, each of which are operable to drive an output load by generating an output voltage, Vout, for the output load. The Class-B stage 202 is a push-pull stage coupled in parallel with another push-pull stage in the Class-AB stage 200. An advantage of the Class-AB+B approach is that two design parameters (minimum output transconductance and current drive capability) become independent and are even physically separated in the Class-AB stage 200 and the Class-B stage 202, with the Class-AB stage 200 providing the minimum output transconductance (for stability) and, thus, minimum quiescent current, Iq, and the Class-B stage 202 providing a large current drive capability.

The Class-AB stage 200 comprises a floating Class-AB input control circuit 210, an optional first biasing circuit 212, an optional second biasing circuit 214, and an AB output circuit 216. The input control circuit 210 is operable to receive input signals in the form of currents I1 and I2 from a preceding amplifier stage of the operational amplifier 102. The input control circuit 210 comprises a first current source 220, a second current source 222, a P-channel transistor 224, and an N-channel transistor 226.

According to one embodiment of the present invention, the first current source 220 may comprise a properly biased P-channel transistor that injects a current I3 into the P-channel transistor 224 and the N-channel transistor 226. Also, the second current source 222 may comprise a properly biased N-channel transistor that draws a current I4 from the P-channel transistor 224 and the N-channel transistor 226, where I3=I4.

The first biasing circuit 212 comprises a current source 230, a first diode-connected P-channel transistor 232, and a second diode-connected P-channel transistor 234. When a bias current I5 flows through the transistors 232 and 234, the gate of the P-channel transistor 224 is $2V_{GS}$ (i.e., two gate-to-source voltage drops) below VDD (the power supply voltage).

The second biasing circuit 214 comprises a current source 240, a first diode-connected N-channel transistor 242, and a second diode-connected N-channel transistor 244. When a bias current I6 flows through the transistors 242 and 244, the gate of the N-channel transistor 226 is $2V_{GS}$ above ground (GND).

The AB output circuit 216 comprises a P-channel transistor 250 and an N-channel transistor 252. For the embodiment in which the current sources 220 and 222 are implemented as transistors, $V_{DS}$ of the first current source 220 in the input control circuit 210 is equal to $V_{GS}$ of the P-channel transistor 250. Similarly, $V_{DS}$ of the second current source 222 in the input control circuit 210 is equal to $V_{GS}$ of the N-channel transistor 252.

The Class-B stage 202 comprises a first level-shifting circuit 260, a second level-shifting circuit 262, and a B output circuit 264. The first level-shifting circuit 260 comprises a current source 270, a level-shifting, P-channel transistor 272, and a neutralizing, N-channel transistor 274. For the illustrated embodiment, the current source 270 comprises a P-channel transistor. The N-channel transistor 274 is operable to neutralize the P-channel transistor 272 of the first level-shifting circuit 260 when the output voltage of the operational amplifier 102 is at a fair distance from its quiescent level.

The second level-shifting circuit 262 comprises a current source 280, a level-shifting, N-channel transistor 282 and a neutralizing, P-channel transistor 284. For the illustrated embodiment, the current source 280 comprises an N-channel transistor. The P-channel transistor 284 is operable to neutralize the N-channel transistor 282 of the second level-shifting circuit 262 when the output voltage of the operational amplifier 102 is at a fair distance from its quiescent level. The B output circuit 264 comprises a P-channel transistor 290 and an N-channel transistor 292.

The current source transistors 270 and 280 are biased by constant voltages (Vb1 and Vb2, respectively) on their gates. These bias voltages are inherently available because the current sources 270 and 280 are each part of a distributed current mirror. A PMOS current mirror comprises the current sources 220, 240 and 270, while an NMOS current mirror comprises the current sources 222, 230 and 280. In addition, the gates of the neutralizing transistors 274 and 284 are coupled to the gates of the current source transistors 270 and 280, respectively. Thus, because of the design of the operational amplifier 102, the gates of the neutralizing transistors 274 and 284 also have constant voltages (Vb1 and Vb2) on their gates. As a result, additional circuitry is not needed to generate constant voltages for the gates of these transistors 274 and 284.

Given a maximum load capacitance, the Class-AB stage 200 may be optimized for the minimum (quiescent) needed transconductance. However, the extra capacitance of the large transistors 290 and 292 of the Class-B stage 202 should be taken into account in the design of the Class-AB stage 200. The quiescent transconductance results in a quiescent current, Iq, in the P-channel transistor 250 and the N-channel transistor 252 that is constrained by a large enough gate-to-source voltage, $V_{GS}$, to keep the transistor that forms the current source 220 and the transistor that forms the current source 222 in saturation at all times. The resulting Class-AB stage 200 cannot deliver enough current to drive the speaker 110 by itself. However, the current booster of the Class-B stage 202 provides the necessary load current instead. Hence, the dimensions of the P-channel transistor 290 and the N-channel transistor 292 may be based on the maximum current that is to be delivered at a minimum drain-to-source voltage, $V_{DS}$.

For one embodiment, the P-channel transistor 290 and the N-channel transistor 292 do not conduct in the quiescent state because the quiescent $V_{GS}$ levels of both transistors 290 and 292 are decreased below their respective threshold voltages by means of the level-shifting circuits 260 and 262 (i.e., source followers). When a bias current I7 flows into the P-channel transistor 272, the gate voltage of the P-channel transistor 290 is higher than the gate voltage of the P-channel transistor 250 by the $V_{GS}$ value of the P-channel transistor 272. Similarly, when a bias current I8 flows through the N-channel transistor 282, the gate voltage of the N-channel transistor 292 is lower than the gate voltage of the N-channel transistor 252 by the $V_{GS}$ value of the N-channel transistor 282. Thus, the added current booster in the Class-B stage 202 has no impact on the total quiescent current of the operational amplifier 102.

At a certain output level, either the P-channel transistor 290 or the N-channel transistor 292 starts to conduct, eventually taking over the main current from the P-channel transistor 250 and the N-channel transistor 252 towards the maximum output level (VDD) or the minimum output level (GND). For one embodiment, the level-shifting circuits 260 and 262 comprise source followers acting as buffers. Thus, the gate-to-source capacitance, $C_{GS}$, of the large output drivers, the P-channel transistor 290 and the N-channel transistor 292, do not load the first stage.

The neutralizing transistors 274 and 284 of the level-shifting circuits 260 and 262 may be relatively small and have no matching constraints. Following is an analysis for the pull branch of the Class-B stage 202, assuming that the current source 280 comprises an N-channel transistor 280:

$$-V_{GS,284}+V_{GS,280}-(V_{GS,292}-V_{GS,282})=0,$$

where $V_{GS,N}$ corresponds to the gate-to-source voltage for the transistor referred to as 'transistor N.' Thus, $$|V_{GS,284}|=V_{GS,292}-V_{GS,280}-V_{GS,282}.$$

In the quiescent state, the second level-shifting circuit 262 is on, so the term $V_{GS,280}-V_{GS,282}$ is very small and:

$$|V_{GS,284}|\approx V_{GS,292}.$$

Furthermore, $V_{GS,292}=V_{GS,252}-V_{GS,282}$, so the transistor 292 and, thus, the transistor 282 are switched off.

Now suppose that the gate voltage of the transistor 282, which is essentially identical to the gate voltage of the transistor 252, goes from its quiescent level to the positive rail (VDD). In absolute terms, the gate-to-source voltage of the transistor 284 increases with the same rate as $V_{GS,252}$. In addition, $V_{GS,292}$ follows at the essentially fixed distance of $V_{GS,282}$ as long as the second level-shifting circuit 262 is on.

($V_{GS,282}$ is not always constant, but increases due to its body effect and because the current I8 increases due to channel-length modulation of the transistor 280.)

At a certain $V_{GS,252}$, the gate-to-source voltage of the transistor 284 exceeds a threshold voltage and the transistor 284 starts to conduct current, reducing the current through the transistor 282. As a result, $V_{GS,282}$ decreases so that $V_{GS,292}$ increases faster than $V_{GS,252}$. Eventually, the current I8 flows completely through the transistor 284 and the transistor 282 is switched off. $V_{GS,292}$ is now practically equal to $V_{GS,252}$ since $V_{GS,292}=V_{GS,252}-V_{DS,284}$, and $V_{DS,284}$ is very small.

A similar analysis can be made for the push branch of the Class-B stage 202. The first level-shifting circuit 260 is neutralized by the transistor 274 at a certain voltage level on the gate of the transistor 250 on its way to the negative rail (GND). By neutralizing the level-shifting circuits 260 and 262 with the neutralizing transistors 274 and 284, the gate-to-source voltages of the transistors of the Class-B stage 202 may become as large as the gate-to-source voltages of the transistors of the Class-AB stage 200. The drive capability of the transistors of the Class-B stage 202 is, therefore, optimally exploited in the operational amplifier 102. As a result, the output voltage of the operational amplifier 102 will clip later than in a comparable Class-AB+B operational amplifier without neutralizing transistors 274 and 284 in the level-shifting circuits 260 and 262.

In the Class-AB stage 200, device matching is used in order to set a specific quiescent current. This is not the case with the Class-B stage 202, including the level-shifting circuits 260 and 262. This provides certain advantages, including that the Class-B stage 202 does not need to be located close to the rest of the circuitry in the operational amplifier 102. Instead, the circuitry of the Class-B stage 202 may be located elsewhere with an arbitrary orientation. In particular, the P-channel transistor 290 and the N-channel transistor 292 (with their high currents and large power dissipation) may be located in strategically advantageous positions (e.g., between the pads) with respect to thermal issues, noise, power and minimum series resistance of the wires.

Although the present invention has been described with an exemplary embodiment, various changes and modifications may be suggested to one skilled in the art. It is intended that the present invention encompass such changes and modifications as fall within the scope of the appended claims.

What is claimed is:

1. An operational amplifier, comprising:
   a Class-AB stage operable to drive an output load; and
   a Class-B stage coupled in parallel with the Class-AB stage, the Class-B stage operable to drive the output load and comprising a first level-shifting circuit and a second level-shifting circuit, the first level-shifting circuit comprising a first neutralizing transistor, and the second level-shifting circuit comprising a second neutralizing transistor.

2. The operational amplifier of claim 1, the first level-shifting circuit further comprising a first current source and a first level-shifting transistor, and the second level-shifting circuit further comprising a second current source and a second level-shifting transistor.

3. The operational amplifier of claim 2,
   the first current source comprising a first P-channel transistor having a source coupled to a power supply,
   the first level-shifting transistor comprising a second P-channel transistor having a source coupled to a drain of the first P-channel transistor, a gate coupled to the Class-AB stage, and a drain coupled to ground, and the first neutralizing transistor comprising a first N-channel transistor having a drain coupled to the source of the second P-channel transistor, a gate coupled to the gate of the first P-channel transistor and a source coupled to the gate of the second P-channel transistor.

4. The operational amplifier of claim 3, the second current source comprising a second N-channel transistor having a source coupled to ground, the second level-shifting transistor comprising a third N-channel transistor having a source coupled to a drain of the second N-channel transistor, a gate coupled to the Class-AB stage, and a drain coupled to the power supply, and the second neutralizing transistor comprising a third P-channel transistor having a drain coupled to the source of the third N-channel transistor, a gate coupled to the gate of the second N-channel transistor and a source coupled to the gate of the third N-channel transistor.

5. The operational amplifier of claim 4, the Class-AB stage comprising an input circuit and an AB output circuit, the AB output circuit comprising a fourth P-channel transistor having a source coupled to the power supply and a gate coupled to the gate of the second P-channel transistor and a fourth N-channel transistor having a source coupled to ground, a gate coupled to the gate of the third N-channel transistor, and a drain coupled to a drain of the fourth P-channel transistor.

6. The operational amplifier of claim 5, the Class-AB stage further comprising a first biasing circuit and a second biasing circuit.

7. The operational amplifier of claim 4, the Class-B stage further comprising a B output circuit, the B output circuit comprising a fourth P-channel transistor having a source coupled to the power supply, a gate coupled to the drain of the first P-channel transistor, and a drain operable to be coupled to the output load and a fourth N-channel transistor having a source coupled to ground, a gate coupled to the drain of the second N-channel transistor, and a drain operable to be coupled to the output load.

8. The operational amplifier of claim 7, the fourth P-channel transistor operable to turn on as an output voltage of the operational amplifier increases towards a voltage of the power supply and the fourth N-channel transistor operable to turn on as an output voltage of the operational amplifier decreases towards ground.

9. A mobile telephone, comprising:

a radio-frequency (RF) transceiver for transmitting an outgoing RF signal and receiving an incoming RF signal;

baseband processing circuitry for processing a forward channel baseband signal received from the RF transceiver and processing a reverse channel baseband signal to send to the RF transceiver; and an operational amplifier capable of amplifying an analog signal in the mobile telephone, the operational amplifier comprising:

a Class-AB stage operable to drive an output load, and a Class-B stage coupled in parallel with the Class-AB stage, the Class-B stage operable to drive the output load and comprising a first level-shifting circuit and a second level-shifting circuit, the first level-shifting circuit comprising a first neutralizing transistor, and the second level-shifting circuit comprising a second neutralizing transistor.

10. The mobile telephone of claim 9, the first level-shifting circuit further comprising a first current source and a first level-shifting transistor, and the second level-shifting circuit further comprising a second current source and a second level-shifting transistor.

11. The mobile telephone of claim 10, the first current source comprising a first P-channel transistor having a source coupled to a power supply, the first level-shifting transistor comprising a second P-channel transistor having a source coupled to a drain of the first P-channel transistor, a gate coupled to the Class-AB stage, and a drain coupled to ground, and the first neutralizing transistor comprising a first N-channel transistor having a drain coupled to the source of the second P-channel transistor, a gate coupled to the gate of the first P-channel transistor and a source coupled to the gate of the second P-channel transistor.

12. The mobile telephone of claim 11, the second current source comprising a second N-channel transistor having a source coupled to ground, the second level-shifting transistor comprising a third N-channel transistor having a source coupled to a drain of the second N-channel transistor, a gate coupled to the Class-AB stage, and a drain coupled to the power supply, and the second neutralizing transistor comprising a third P-channel transistor having a drain coupled to the source of the third N-channel transistor, a gate coupled to the gate of the second N-channel transistor and a source coupled to the gate of the third N-channel transistor.

13. The mobile telephone of claim 12, the Class-AB stage comprising an input circuit and an AB output circuit, the AB output circuit comprising a fourth P-channel transistor having a source coupled to the power supply and a gate coupled to the gate of the second P-channel transistor and a fourth N-channel transistor having a source coupled to ground, a gate coupled to the gate of the third N-channel transistor, and a drain coupled to a drain of the fourth P-channel transistor.

14. The mobile telephone of claim 13, the Class-AB stage further comprising a first biasing circuit and a second biasing circuit.

15. The mobile telephone of claim 12, the Class-B stage further comprising a B output circuit, the B output circuit comprising a fourth P-channel transistor having a source coupled to the power supply, a gate coupled to the drain of the first P-channel transistor, and a drain operable to be coupled to the output load and a fourth N-channel transistor having a source coupled to ground, a gate coupled to the drain of the second N-channel transistor, and a drain operable to be coupled to the output load.

16. The mobile telephone of claim 15, the fourth P-channel transistor operable to turn on as an output voltage of the operational amplifier increases towards a voltage of the power supply and the fourth N-channel transistor operable to turn on as an output voltage of the operational amplifier decreases towards ground.

17. An operational amplifier comprising a Class-AB+B output stage, the Class-B output stage comprising:

a B output circuit operable to drive an output load;

a first level-shifting circuit coupled to the B output circuit, the first level-shifting circuit comprising a first neutralizing transistor; and a second level-shifting circuit coupled to the B output circuit, the second level-shifting circuit comprising a second neutralizing transistor.

18. The operational amplifier of claim 17, the first level-shifting circuit further comprising a first current source and a first level-shifting transistor, and the second level-shifting circuit further comprising a second current source and a second level-shifting transistor.

19. The operational amplifier of claim 18,
the first current source comprising a first P-channel transistor having a source coupled to a power supply, the first level-shifting transistor comprising a second P-channel transistor having a source coupled to a drain of the first P-channel transistor, a gate coupled to the Class-AB stage, and a drain coupled to ground, and the first neutralizing transistor comprising a first N-channel transistor having a drain coupled to the source of the second P-channel transistor, a gate coupled to the gate of the first P-channel transistor and a source coupled to the gate of the second P-channel transistor, and
the second current source comprising a second N-channel transistor having a source coupled to ground, the second level-shifting transistor comprising a third N-channel transistor having a source coupled to a drain of the second N-channel transistor, a gate coupled to the Class-AB stage, and a drain coupled to the power supply, and the second neutralizing transistor comprising a third P-channel transistor having a drain coupled to the source of the third N-channel transistor, a gate coupled to the gate of the second N-channel transistor and a source coupled to the gate of the third N-channel transistor.

20. The operational amplifier of claim 19, the B output circuit comprising a fourth P-channel transistor having a source coupled to the power supply, a gate coupled to the drain of the first P-channel transistor, and a drain operable to be coupled to the output load and a fourth N-channel transistor having a source coupled to ground, a gate coupled to the drain of the second N-channel transistor, and a drain operable to be coupled to the output load.

* * * * *